US012598786B2

(12) United States Patent
Chang et al.

(10) Patent No.: US 12,598,786 B2
(45) Date of Patent: Apr. 7, 2026

(54) FIELD EFFECT TRANSISTOR STRUCTURES

(71) Applicant: Adeia Semiconductor Solutions LLC,
San Jose, CA (US)

(72) Inventors: Josephine B. Chang, Bedford Hills,
NY (US); Bruce B. Doris, Slingerlands,
NY (US); Michael A. Guillorn, Cold
Springs, NY (US); Isaac Lauer,
Yorktown Heights, NY (US); Xin Miao,
Guilderland, NY (US)

(73) Assignee: Adeia Semiconductor Solutions LLC,
San Jose, CA (US)

( * ) Notice: Subject to any disclaimer, the term of this
patent is extended or adjusted under 35
U.S.C. 154(b) by 0 days.

(21) Appl. No.: 17/313,700

(22) Filed: May 6, 2021

(65) Prior Publication Data

US 2021/0280674 A1 Sep. 9, 2021

Related U.S. Application Data

(60) Continuation of application No. 16/042,498, filed on
Jul. 23, 2018, now Pat. No. 11,004,933, which is a
(Continued)

(51) Int. Cl.
| | |
|---|---|
| *H10D 64/01* | (2025.01) |
| *H10D 30/01* | (2025.01) |
| *H10D 30/43* | (2025.01) |
| *H10D 30/62* | (2025.01) |
| *H10D 30/67* | (2025.01) |
| *H10D 62/10* | (2025.01) |
| *H10D 62/13* | (2025.01) |
| *H10D 64/23* | (2025.01) |

(52) U.S. Cl.
CPC ......... *H10D 62/121* (2025.01); *H10D 30/014*
(2025.01); *H10D 30/024* (2025.01); *H10D
30/43* (2025.01); *H10D 30/62* (2025.01);
*H10D 30/6735* (2025.01); *H10D 30/6757*
(2025.01); *H10D 62/151* (2025.01); *H10D
64/01* (2025.01); *H10D 64/015* (2025.01);
*H10D 64/017* (2025.01); *H10D 64/018*
(2025.01); *H10D 64/021* (2025.01); *H10D
64/251* (2025.01)

(58) Field of Classification Search
CPC ........................ H01L 29/66545; H10D 64/017
USPC ......................................................... 438/197
See application file for complete search history.

(56) References Cited

U.S. PATENT DOCUMENTS

| | | |
|---|---|---|
| 6,642,115 B1 | 11/2003 | Cohen et al. |
| 6,759,730 B2 | 7/2004 | Chaudhry et al. |

(Continued)

OTHER PUBLICATIONS

List of IBM Patents or Patent Applications Treated as Related dated
Jul. 23, 2018, 2 pages.

(Continued)

*Primary Examiner* — Hsin Yi Hsieh
(74) *Attorney, Agent, or Firm* — HG LAW LLP

(57) ABSTRACT

Field effect transistors include a stack of nanowires of
vertically arranged channel layers. A source and drain region
is disposed at respective ends of the vertically arranged
channel layers. A gate stack is formed over, around, and
between the vertically arranged channel layers. Internal
spacers are each formed between the gate stack and a
respective source or drain region, with at least one pair of
spacers being positioned above an uppermost channel layer.

21 Claims, 9 Drawing Sheets

1702

1402

102

100

Related U.S. Application Data division of application No. 15/045,759, filed on Feb. 17, 2016, now Pat. No. 10,096,673.

(56) References Cited

U.S. PATENT DOCUMENTS

| | | | |
|---|---|---|---|
| 7,700,991 B2 | 4/2010 | Hsiao et al. | |
| 8,551,833 B2 | 10/2013 | Chang et al. | |
| 8,735,248 B2 | 5/2014 | Lee et al. | |
| 9,157,887 B2 | 10/2015 | Guo et al. | |
| 9,425,291 B1* | 8/2016 | Balakrishnan | H01L 29/66469 |
| 9,431,301 B1* | 8/2016 | Chu | H01L 29/775 |
| 9,502,500 B2* | 11/2016 | Leobandung | H01L 29/42392 |
| 9,882,026 B2 | 1/2018 | Tapily et al. | |
| 10,096,673 B2 | 10/2018 | Chang et al. | |
| 10,658,461 B2 | 5/2020 | Chang et al. | |
| 11,004,933 B2 | 5/2021 | Chang et al. | |
| 2004/0023460 A1 | 2/2004 | Cohen et al. | |
| 2004/0229440 A1* | 11/2004 | Kim | G02B 6/266 |
| | | | 438/400 |
| 2011/0031473 A1* | 2/2011 | Chang | H10B 10/12 |
| | | | 257/E27.098 |
| 2014/0353734 A1 | 12/2014 | Xie et al. | |
| 2015/0035060 A1 | 2/2015 | Cheng et al. | |
| 2015/0069328 A1* | 3/2015 | Leobandung | H10D 62/116 |
| | | | 438/151 |
| 2015/0295084 A1 | 10/2015 | Obradovic et al. | |
| 2016/0020305 A1* | 1/2016 | Obradovic | H01L 29/7391 |
| | | | 438/157 |
| 2016/0365411 A1* | 12/2016 | Yeh | H01L 29/66439 |
| 2017/0005180 A1* | 1/2017 | Cheng | H01L 29/66553 |
| 2017/0236900 A1 | 8/2017 | Chang et al. | |
| 2018/0331180 A1 | 11/2018 | Chang et al. | |
| 2018/0350909 A1 | 12/2018 | Chang et al. | |

OTHER PUBLICATIONS

Office action for U.S. Appl. No. 16/042,498, mailed on Sep. 24, 2020, Chang, "Field effect transistor structures", 13 pages.

* cited by examiner

704

1402

102

100

1602

1402

102

100

1

FIELD EFFECT TRANSISTOR STRUCTURES

CROSS-REFERENCE TO RELATED APPLICATION

This patent application is a continuation of and claims priority to U.S. patent application Ser. No. 16/042,498, filed Jul. 23, 2018, now U.S. Pat. No. 11,004,933, issued May 11, 2021, which is a divisional of U.S. patent application Ser. No. 15/045,759, filed Feb. 17, 2016, now U.S. Pat. No. 10,096,673, issued Oct. 9, 2018, which are fully incorporated herein by reference.

BACKGROUND

Technical Field

The present invention relates to stacked-channel field effect transistors and, more particularly, to the use of a sacrificial layer to improve retention of top channel layers.

Description of the Related Art

Stacked nanowire and nanosheet devices are proposed for modern and next-generation semiconductor devices. The devices are formed around thin channel materials, configured as either wires or sheets of semiconductor material. Parasitic capacitance in nanosheet devices is a significant performance detractor, which can be mitigated through the formation of an inner spacer between a gate stack and the source and drain regions.

However, the dummy gate processes used to form stacked nanowire and nanosheet devices can cause significant damage to the small-scale channel structures. In particular, etching processes used to remove dummy gate structures and form inner spacers are not perfectly selective and damages the top layer of a nanowire or nanosheet channel. In many cases, the top layer of a channel is destroyed entirely by the process.

SUMMARY

A field effect transistor includes a stack of nanowires of vertically arranged channel layers. A source and drain region is disposed at respective ends of the vertically arranged channel layers. A gate stack is formed over, around, and between the vertically arranged channel layers. Internal spacers are each formed between the gate stack and a respective source or drain region, with at least one pair of spacers being positioned above an uppermost channel layer.

A field effect transistor includes a stack of nanowires of vertically arranged channel layers. A source and drain region is disposed at respective ends of the vertically arranged channel layers. A gate stack is formed over, around, and between the vertically arranged channel layers. Internal spacers are each formed between the gate stack and a respective source or drain region and each has a crescent shape, with at least one pair of spacers being positioned above an uppermost channel layer.

A field effect transistor includes a stack of nanowires of vertically arranged channel layers. A source and drain region is disposed at respective ends of the vertically arranged channel layers. A gate stack is formed over, around, and between the vertically arranged channel layers. Internal spacers are each formed between the gate stack and a respective source or drain region and each has a crescent shape, with at least one pair of spacers being positioned above an uppermost channel layer. The at least one pair of spacers that are positioned above an uppermost channel layer further include a vertical extension that extends above a height of the source and drain region.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention employ a layer of epitaxially grown sacrificial material on a top layer of a nanowire channel. This sacrificial layer protects the top layer from subsequent etches and prevents damage to the channel material. In addition, the presence of the sacrificial layer leads to the formation of an inner spacer above the uppermost channel layer.

Figure 1:
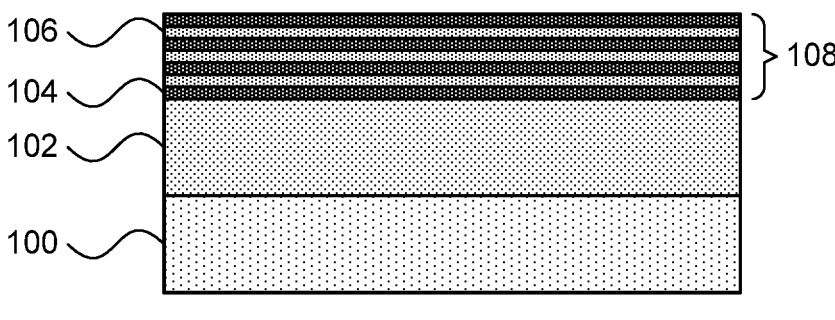
FIG. 1 is a cross-sectional diagram of a step in forming a field effect transistor in accordance with the present principles.

Referring now to the drawings in which like numerals represent the same or similar elements and initially to FIG. 1, a step in the formation of a field effect transistor (FET) is shown. In the present embodiments, a semiconductor-on-insulator (SOI) embodiment is shown. Specifically, the SOI structure includes a bottom semiconductor layer in the form of, e.g., a silicon substrate 100. An insulating layer 102 lies over the substrate 100 and may be formed from, e.g., silicon dioxide. The semiconductor layer 100 may include any appropriate semiconductor material including, e.g., silicon, silicon germanium, silicon germanium carbide, silicon carbide, polysilicon, epitaxial silicon, amorphous silicon, and multilayers thereof. Although silicon is the predominantly used semiconductor material in wafer fabrication, alternative semiconductor materials can be employed, such as, but not limited to, germanium, gallium arsenide, gallium nitride, silicon germanium, cadmium telluride and zinc selenide. The insulating layer may be a buried oxide region formed from, e.g., silicon dioxide, but it should be understood that any suitable dielectric material may be used. Exemplary alternative dielectric materials which may be used include, e.g., hafnium oxide, zirconium oxide, lanthanum oxide, aluminum oxide, titanium oxide, strontium titanium oxide, lanthanum aluminum oxide, yttrium oxide, hafnium oxynitride, zirconium oxynitride, lanthanum oxynitride, aluminum oxynitride, strontium titanium oxynitride, lanthanum aluminum oxynitride, yttrium oxynitride, silicates of the above, and alloys of the above.

On top of the insulating layer 102 is a stack 108 of semiconductor materials. The stack includes alternating layers of sacrificial material 104 and channel material 106. In one particular embodiment, it is specifically contemplated that the sacrificial material 104 may be formed from, e.g., silicon germanium, while the channel material 106 may be formed from, e.g., silicon. While it is specifically contemplated that the sacrificial material 104 may be silicon germanium, it should be understood that any material may be used that has etch selectivity with the channel material 106, such that the sacrificial material 104 may be removed without harming structures made from the channel material 106.

Suitable materials for the channel material 106 include, for example, silicon, silicon germanium, silicon germanium carbide, silicon carbide, polysilicon, epitaxial silicon, amorphous silicon, multi-layers thereof, germanium, gallium arsenide, gallium nitride, silicon germanium, cadmium telluride, and zinc selenide. III-V semiconductors may alternatively be used for the channel material 106. The term "III-V compound semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present embodiments include, but are not limited to alloys of gallium arsenic, aluminum arsenic, indium gallium arsenic, indium aluminum arsenic, indium aluminum arsenic antimony, indium aluminum arsenic phosphorus, indium gallium arsenic phosphorus and combinations thereof.

It is specifically contemplated that the stack 108 may be epitaxially grown. This refers to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move on the surface and orient themselves to the crystal arrangement of the atoms of the deposition surface. Thus, in some examples, an epitaxial film deposited on a {100} crystal surface will take on a {100} orientation.

In the case of a silicon channel material 106, the silicon gas source for epitaxial deposition may be selected from the group consisting of, e.g., hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. In the case of a silicon germanium sacrificial material, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof.

Figure 2:
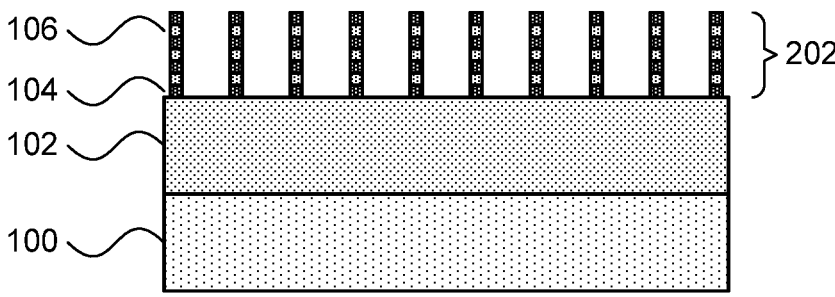
FIG. 2 is a cross-sectional diagram of a step in forming a field effect transistor in accordance with the present principles.

Referring now to FIG. 2, a step in the formation of a FET is shown. In this step, the stack 108 is etched to form fins 202 (having a length perpendicular to the cross-section shown. Any appropriate anisotropic etch may be used to form the fins 202, with material being removed in the direction normal to the surface of the stack 108 at a rate that is greater than in the direction parallel to the surface. Although narrow fins 202 are shown, any width of fin may be used to create structures having any width from nanowires to nanosheets. It should be understood that a nanowire has a cross-sectional height that is on the same order of magnitude as its cross-sectional width (in one specific embodiment, a nanowire has a ratio of cross-sectional width to cross-sectional height of less than 2:1), whereas a nanosheet has a cross-sectional height that is significantly smaller than its cross-sectional width (in one specific embodiment, having a ratio of cross-sectional width to cross-sectional height of greater than 2:1).

In one exemplary embodiment, a reactive ion etch (RIE) may be used to form the fins 202. RIE is a form of plasma etching in which, during etching, the surface to be etched is placed on an RF powered electrode. During RIE, the surface to be etched takes on a potential that accelerates the etching species' extracted from plasma toward the surface, with the chemical etching reaction taking place in the direction normal to the surface. Other examples of anisotropic etching that can be used include ion beam etching, plasma etching or laser ablation. Alternatively, the fin structure 202 can be formed by spacer imaging transfer.

The etch is selective to the material of the insulator layer 102. As used herein, the term "selective" in reference to a material removal process denotes that the rate of material removal for a first material is greater than the rate of removal for at least another material of the structure to which the material removal process is being applied. In this case, the etch is performed in a manner that is selective between the stack 108 of sacrificial material 104 and channel material 106.

Figure 3:
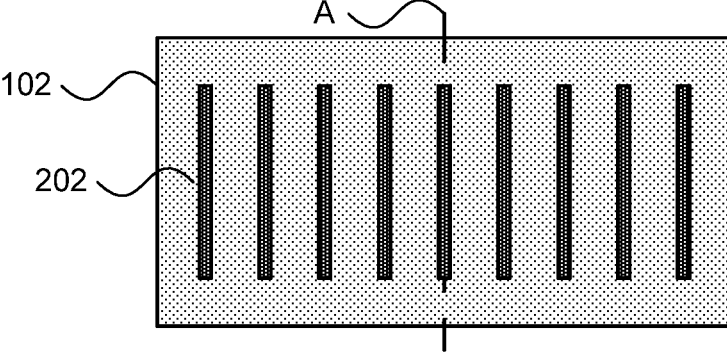
FIG. 3 is a top-down diagram of a step in forming a field effect transistor in accordance with the present principles.

Referring now to FIG. 3, a top-down view of the step of FIG. 2 is shown. The fins 202 shown as being disposed on the insulator layer 102 at regular intervals, but it should be understood that any number of fins 202 may be used at any fixed or varying spacing. Also shown with dashed line A is a cross-section to be used for the following figures and discussion.

Figure 4:
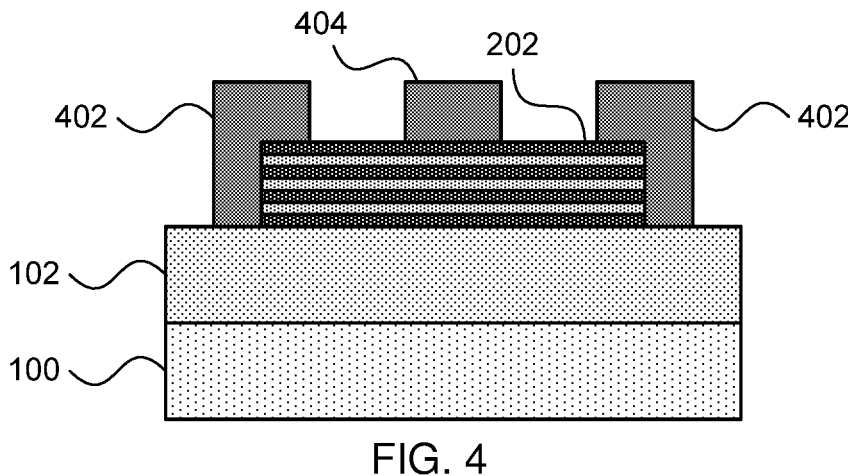
FIG. 4 is a cross-sectional diagram of a step in forming a field effect transistor in accordance with the present principles.

Referring now to FIG. 4, a cross-sectional view of a step in the formation of a FET is shown along the cross-section A. A set of dummy gates is deposited, with two outside dummy gates 402 and a central dummy gate 404. The dummy gates 402 and 404 may be formed from a semiconductor material including, e.g., polysilicon or amorphous silicon, that has etch selectivity with the sacrificial material 104. The dummy gates 402 and 404 cover the ends of the fins 202 and the center of the fins 202, while leaving the areas between exposed. The dummy gates 402/404 may be formed by depositing material over the fins 202 and subsequently patterning the into the dummy gate material using any appropriate lithography or etch process.

Figure 5:
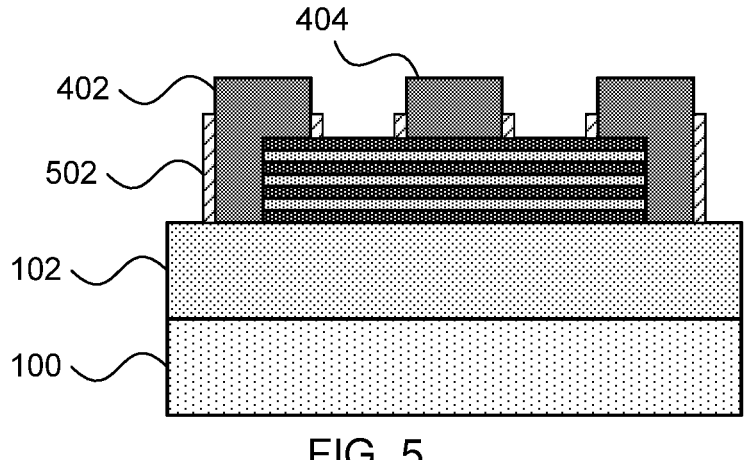
FIG. 5 is a cross-sectional diagram of a step in forming a field effect transistor in accordance with the present principles.

Referring now to FIG. 5, a cross-sectional view of a step in the formation of a FET is shown along the cross-section A. Spacers 502 are deposited conformally along the sidewalls of the gates 402 and 404. Spacer material 502 may be removed from the sidewalls of the fins 202 using an anisotropic etch such as RIE. Note that the present figures are not drawn exactly to scale—the removal of the spacer material 502 from the sidewalls of the fins 202 will result in an etch back along the sidewalls of the dummy gates 404 at least as deep as the height of the fins 202. Deposition of the spacers 502 may include any appropriate deposition process including, e.g., chemical vapor deposition (CVD), physical vapor deposition, or atomic layer deposition. In one particular embodiment, the spacers 502 may be formed from a hardmask material such as, e.g., silicon nitride. Other hardmask compositions for the spacers 502 include silicon oxides, silicon oxynitrides, silicon carbides, silicon carbonitrides, etc. Spin-on dielectrics may also be utilized as a hardmask material including, but not limited to: silsesquioxanes, siloxanes, and boron phosphate silicate glass.

CVD is a deposition process in which a deposited species is formed as a result of chemical reaction between gaseous reactants at greater than room temperature (e.g., from about 25° C. to about 900° C.). The solid product of the reaction is deposited on the surface on which a film, coating, or layer of the solid product is to be formed. Variations of CVD processes include, but not limited to, Atmospheric Pressure CVD, Low Pressure CVD and Plasma Enhanced CVD, Metal-Organic CVD, and combinations thereof. PVD may include processes such as sputtering where, for example, DC diode systems, radio frequency sputtering, magnetron sputtering, and ionized metal plasma sputtering.

Figure 6:
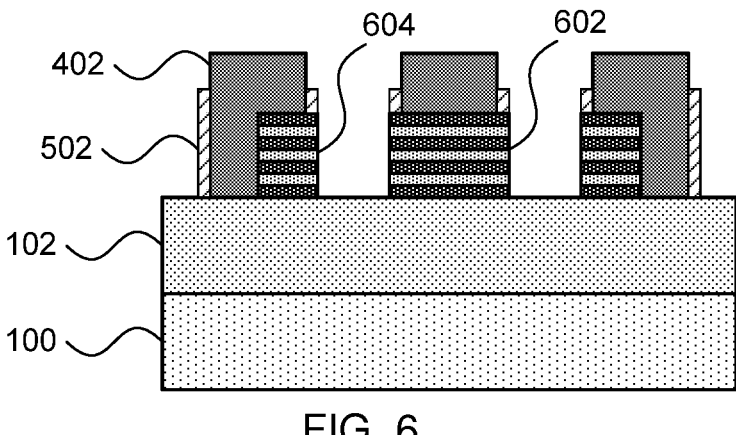
FIG. 6 is a cross-sectional diagram of a step in forming a field effect transistor in accordance with the present principles.

Referring now to FIG. 6, a cross-sectional view of a step in the formation of a FET is shown along the cross-section A. Portions of the fins 202 are etched away, leaving a channel region 602 under the central dummy gate 404, with remnants 604 embedded in the lateral dummy gates 402. An anisotropic etch, such as RIE, is used to remove the material in the regions that will eventually become the source and drain of the device.

Figures 7, 8:
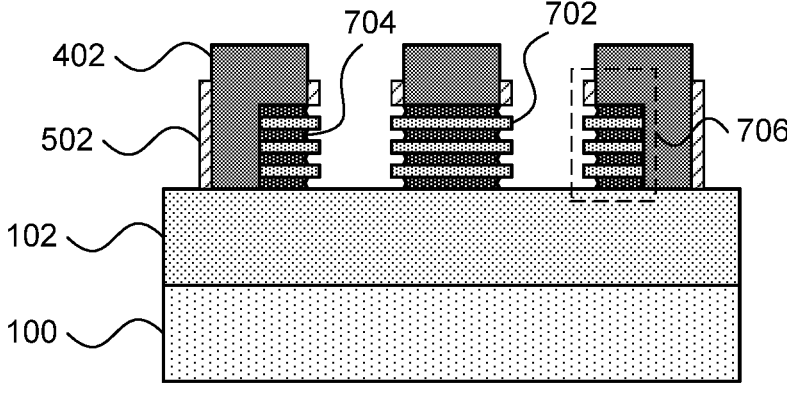
FIG. 7 is a cross-sectional diagram of a step in forming a field effect transistor in accordance with the present principles.
FIG. 8 is a cross-sectional diagram of a step in forming a field effect transistor in accordance with the present principles.

Referring now to FIG. 7, a cross-sectional view of a step in the formation of a FET is shown along the cross-section A. A selective, timed, isotropic etch is used to remove some of the sacrificial material 104, recessing the sacrificial material 104 with respect to the channel material 106. This results in recessed sacrificial material 704 and protruding channel material 702. The term "isotropic etch" denotes an etch process that is non-directional. By "non-directional" it is meant that the etch rate is not substantially greater in any one direction in comparison to all of the etch directions. The etch is timed, with a known etching rate being used to determine how long to allow the etch to continue to achieve a predetermined degree of recess in the recessed sacrificial material 704. One notable feature of the recessed sacrificial material 704 is emphasized in the dashed box 706, shown in greater detail in FIG. 8 below.

The isotropic etch may be a wet chemical etch or a dry etch. For example, the etchant may be a corrosive liquid or a chemically active ionized gas, such as a plasma. The precise composition of the etch will depend on the character of the sacrificial material 104 and the channel material 106, with the etch selectively removing only the sacrificial material. For example, wet etches may include inorganic acids and oxidizing agents that do not attack the channel material 106 may be used. Examples of oxidizing agents may include peroxides, nitrates, nitrites, perchlorates, chlorates, chlorites, hypochlorites, dichromates, permanganates, persulfates or combinations thereof. The inorganic acids can include hydrochloric acid, hydrofluoric acid, sulfuric acid, phosphoric acid, or combinations thereof.

Referring now to FIG. 8, an expanded view of box 706 is shown. In particular, detail on the recessed layers of sacrificial material 704 is shown. The etch that recessed the sacrificial material 704 is not perfectly isotropic, leaving a curved shape 802 to the outward facing surface of the recessed sacrificial material 704.

Figure 9:
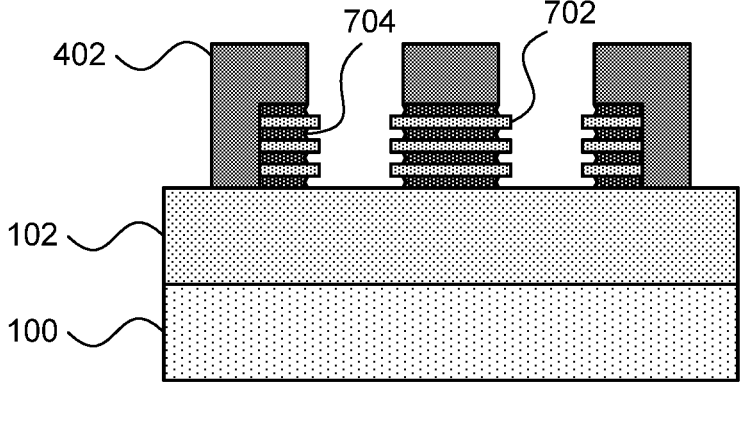
FIG. 9 is a cross-sectional diagram of a step in forming a field effect transistor in accordance with the present principles.

Referring now to FIG. 9, a cross-sectional view of a step in the formation of a FET is shown along the cross-section A. In this step, the spacers 502 are removed using an isotropic etch. As above, the isotropic etch may be a wet chemical etch or a dry etch. The removal of the spacers 502 exposes the sidewalls of the dummy gates 402 and 404.

Figure 10:
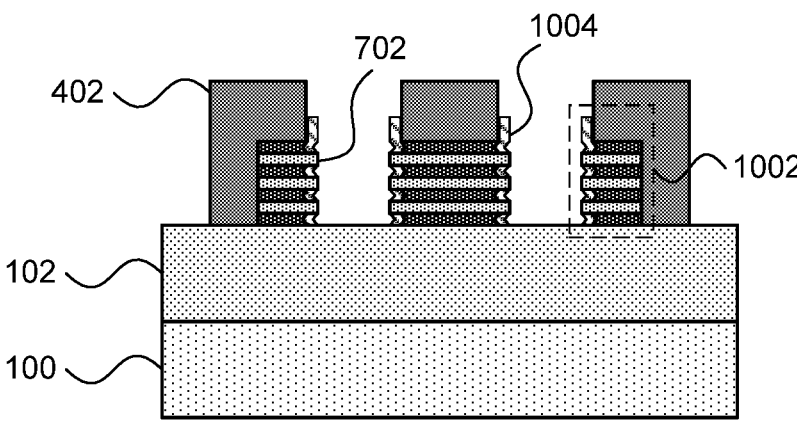
FIG. 10 is a cross-sectional diagram of a step in forming a field effect transistor in accordance with the present principles.

Referring now to FIG. 10, a cross-sectional view of a step in the formation of a FET is shown along the cross-section A. A layer of spacer material is conformally deposited over the surfaces of the gates 402/404, the recessed sacrificial material 704, and the protruding channel material 702. As above, deposition of the spacers 1004 may include any appropriate deposition process including, e.g., chemical vapor deposition (CVD), physical vapor deposition, or atomic layer deposition. In one particular embodiment, the spacers 704 may be formed from a hardmask material such as, e.g., silicon nitride. Other hardmask compositions for the spacers 704 include silicon oxides, silicon oxynitrides, silicon carbides, silicon carbonitrides, etc. Spin-on dielectrics may also be utilized as a hardmask material including, but not limited to: silsesquioxanes, siloxanes, and boron phosphate silicate glass.

An anisotropic etch, such as RIE, is used to remove spacer material from the facing surfaces of the protruding channel material 702, exposing a face of the channel material. The resulting surface is emphasized in the dashed box 1002 and shown in greater detail below.

Figure 11:
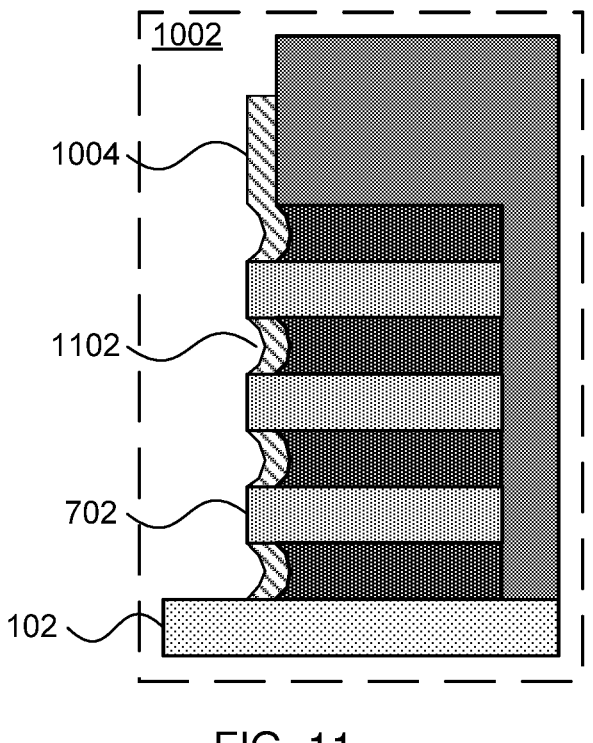
FIG. 11 is a cross-sectional diagram of a step in forming a field effect transistor in accordance with the present principles.

Referring now to FIG. 11, an expanded view of box 1002 is shown. In particular, detail on the spacer 1004 is shown. In particular, after removal of the material on the facing surface of the protruding channel material 702, spacer material 1102 remains in the recessed portions of the recessed sacrificial material 704. In practice, these spacers 1102 form "crescent moon" shapes that remain as a structural component of the finished device. In contrast to conventional devices, the presence of a layer of sacrificial material 704 on top of the uppermost layer of protruding channel material 702 causes one such spacer 1102 to form above the uppermost layer of protruding channel material 702.

Figure 12:
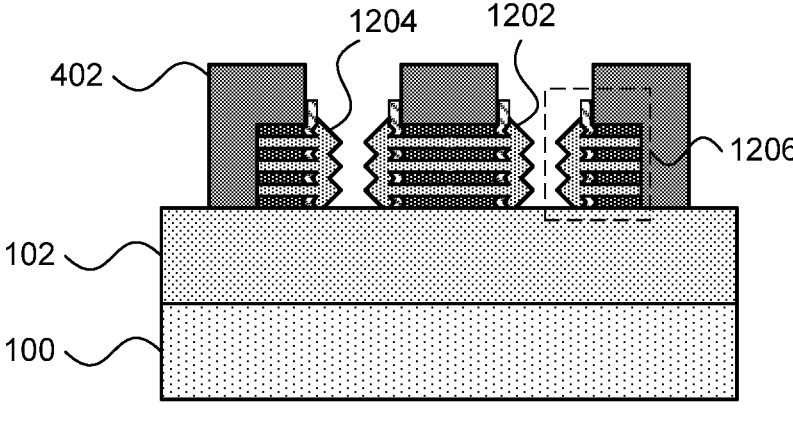
FIG. 12 is a cross-sectional diagram of a step in forming a field effect transistor in accordance with the present principles.

Referring now to FIG. 12, a cross-sectional view of a step in the formation of a FET is shown along the cross-section A. Source and drain regions are epitaxially grown from the exposed faces of the channel material 702, with vertically adjacent channel layers merging to produce active source/ drain regions 1202 and vestigial source/drain regions 1204. In the case of a silicon channel material 702, the silicon gas source for epitaxial deposition may be selected from the group consisting of, e.g., hexachlorodisilane, tetrachlorosi- lane, dichlorosilane, trichlorosilane, methylsilane, dimeth- ylsilane, ethylsilane, methyldisilane, dimethyldisilane, hex- amethyldisilane and combinations thereof. As shown, growth follows a crystalline growth pattern that follows the crystalline structure of the facing surface of the protruding channel material 702. The vestigial merged source/drain regions 1204 are emphasized in dashed box 1206 and shown in FIG. 13 below.

The source/drain regions 1202/1204 may be doped with dopant atoms. The dopant atoms may be an n-type dopant (i.e., an element from Group IV or VI of the Periodic Table of Elements) or a p-type dopant (i.e., an element from Group II or VI of the Periodic Table of Elements). Exemplary n-type dopants for a group IV semiconductor include phos- phorus, arsenic and antimony. Exemplary p-type dopants for a group IV semiconductor include boron, aluminum, and gallium. Exemplary n-type dopants for a III-V semiconduc- tor include selenium, tellurium, silicon, and germanium. Exemplary p-type dopants for a III-V semiconductor include beryllium, zinc, cadmium, silicon, and germanium. The concentration of dopant within the doped region is typically from about 1011 to about 1015 atoms/cm2, with a concen- tration of dopant within the doped region from about 1011 to about 1013 atoms/cm2 being more typical. The source/ drain regions 1202/1204 may be in situ doped as they are grown on the channel material 702 or, alternatively, may be doped through an implantation process. Notably, the channel material 702 that remains underneath the dummy gates 402/404 is not doped.

Figure 13:
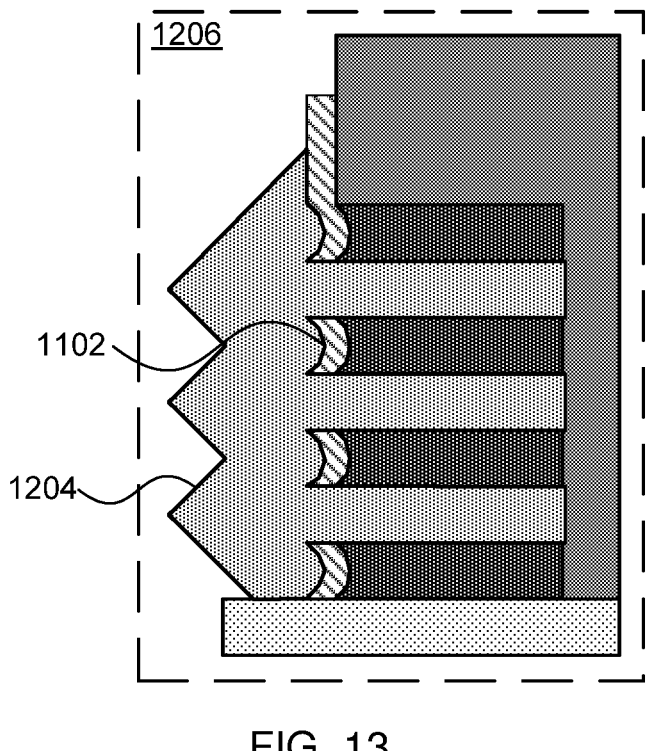
FIG. 13 is a cross-sectional diagram of a step in forming a field effect transistor in accordance with the present principles.

Referring now to FIG. 13, an expanded view of box 1206 is shown. In particular, detail on the merged source/drain region 1204 is shown. It should be understood that the active source/drain regions 1202 and the vestigial source/drain regions 1204 are essentially similar in structure. The verti- cally adjacent channel layers merge and become a single crystalline structure, with the crescent moon spacers 1102 trapped within.

Figure 14:
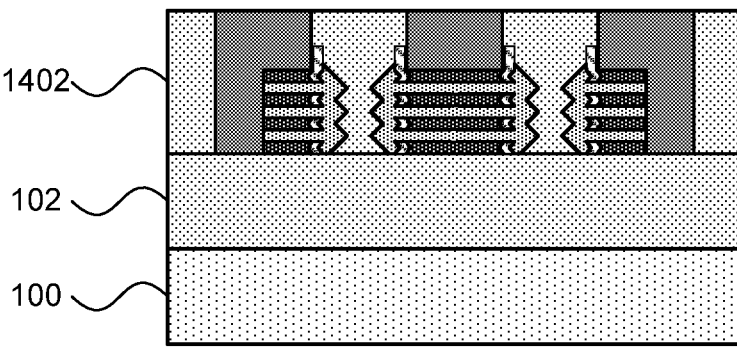
FIG. 14 is a cross-sectional diagram of a step in forming a field effect transistor in accordance with the present principles.

Referring now to FIG. 14, a cross-sectional view of a step in the formation of a FET is shown along the cross-section A. Dielectric material 1402 is filled to or above the level of the top surface of the dummy gates 402/404. It is specifically contemplated that the dielectric material 1402 may have the same composition as the insulator layer 102 or may, alter- natively, be formed from any appropriate insulating mate- rial. If the dielectric material 1402 is filled to a level above the top surface of the dummy gates 402/404, the material may then be polished down to the level of the dummy gates 402/404 using a chemical mechanical planarization that stops on the material of the dummy gates 402/404.

Figures 15, 16:
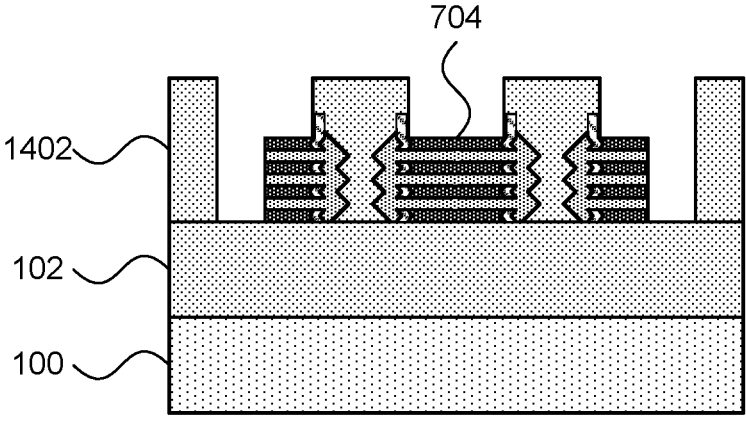
FIG. 15 is a cross-sectional diagram of a step in forming a field effect transistor in accordance with the present principles.
FIG. 16 is a cross-sectional diagram of a step in forming a field effect transistor in accordance with the present principles.
Figure 17:
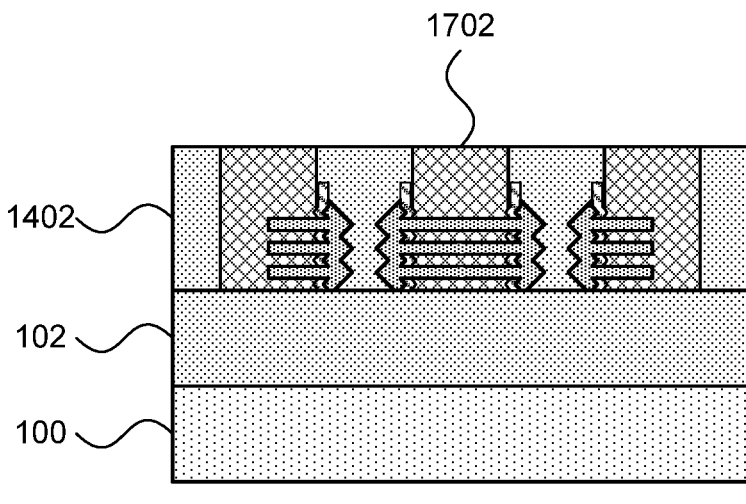
FIG. 17 is a cross-sectional diagram of a step in forming a field effect transistor in accordance with the present principles.

Referring now to FIG. 15, a cross-sectional view of a step in the formation of a FET is shown along the cross-section A. The dummy gates 402/404 have been removed, exposing the remaining sacrificial material 704. An anisotropic etch is used to remove the dummy gate material, but it should be recognized that no anisotropic etch is perfectly selective. This etch will cause some damage to the top layer of the sacrificial material 704—the presence of the sacrificial mate- rial 704 protects the underlying channel layers from damage.

Referring now to FIG. 16, a cross-sectional view of a step in the formation of a FET is shown along the cross-section A. An isotropic etch is used to remove the remaining sacrificial material 704, leaving channels 1602 exposed. The etch may be a wet etch or a dry etch. For example, wet etches may include inorganic acids and oxidizing agents that do not attack the channel material 106 may be used. Examples of oxidizing agents may include peroxides, nitrates, nitrites, perchlorates, chlorates, chlorites, hypochlorites, dichro- mates, permanganates, persulfates or combinations thereof. The inorganic acids can include hydrochloric acid, hydro- fluoric acid, sulfuric acid, phosphoric acid, or combinations thereof.

Referring now to FIG. 16, a cross-sectional view of a step in the formation of a FET is shown along the cross-section A. A gate stack 1702 is formed, including for example a gate dielectric layer, a work function metal, and a gate material that may be deposited and planarized according to any appropriate process. The device may be finished by forming electrical contacts to the active source/drain regions 1202 and the gate stack 1702.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no inter- vening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another ele- ment, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Inter- net) to such entities, directly or indirectly. The stored design is then converted into the appropriate format (e.g., GDSII) for the fabrication of photolithographic masks, which typi- cally include multiple copies of the chip design in question that are to be formed on a wafer. The photolithographic masks are utilized to define areas of the wafer (and/or the layers thereon) to be etched or otherwise processed.

Methods as described herein may be used in the fabrica- tion of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 18:
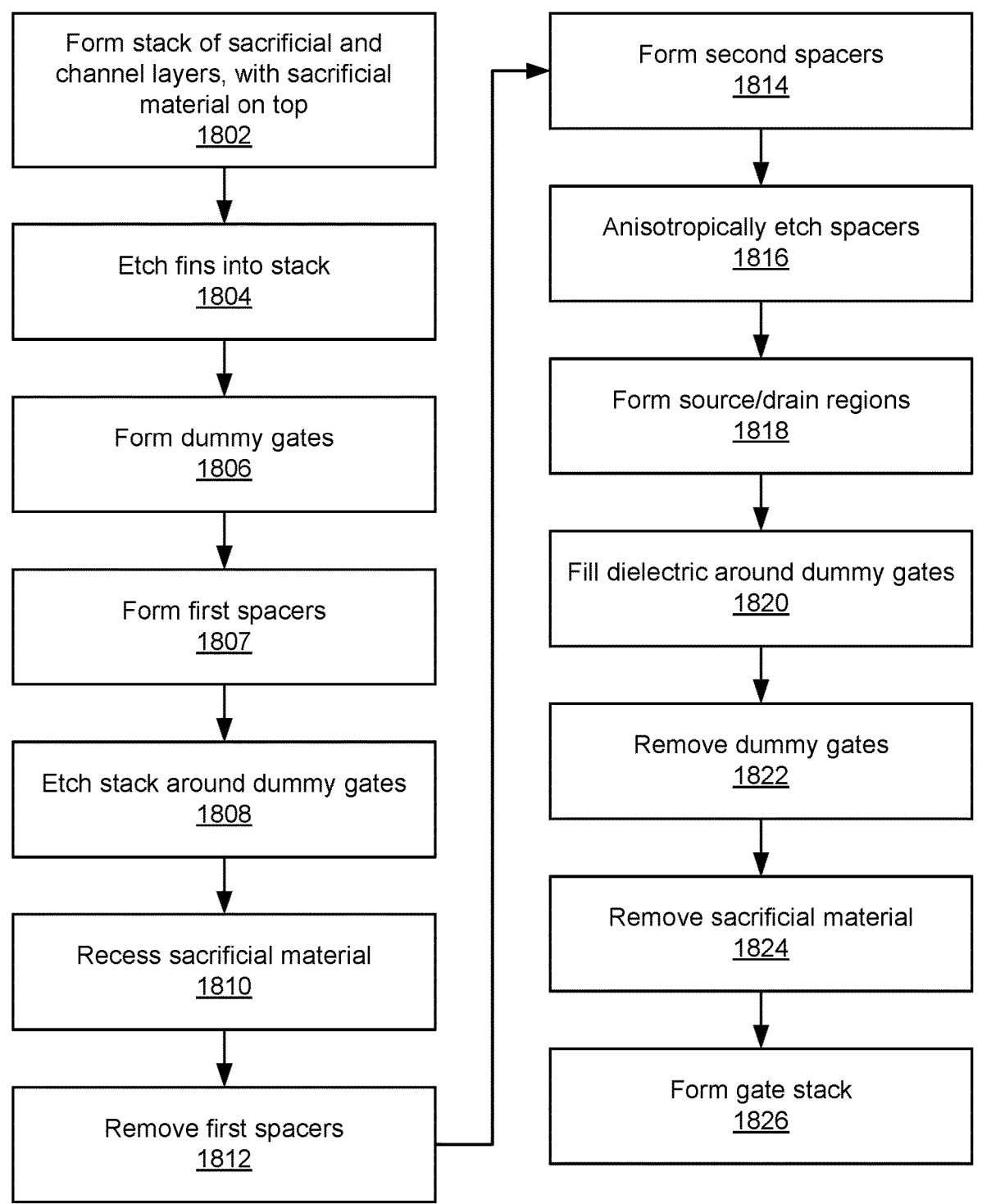
FIG. 18 is a block/flow diagram of a method of forming a field effect transistor in accordance with the present principles.

Referring now to FIG. 18, a block/flow diagram of a method of forming a FET is shown. Block 1802 forms the stack 108 of layers of sacrificial material 104 and layers of channel material 106, with a layer of sacrificial material at the top of the stack 108. Block 1802 etches fins 202 into the stack 108, with each fin 202 providing the basis for a FET and being spaced apart in accordance with design needs and technology limits.

Block 1806 forms dummy gates 402 and 404 over the spacers, depositing a layer of material and etching away any material that does not belong to the dummy gates 402/404 using, e.g., photolithography or an anisotropic etch. Block 1807 forms spacers 502 on the sidewalls of the dummy gates 402/404 by, e.g., conformally depositing a layer of spacer material and anisotropically etching them material from horizontal surfaces. Block 1808 then anisotropically etches the fins 202 from areas around the dummy gates 402/404, leaving three fin regions remaining underneath the dummy gates 402/404.

Block 1810 uses an isotropic etch, for example a wet chemical etch, to selectively recess the sacrificial material and create recessed sacrificial layers 704 with recesses 802. Block 1812 removes the remaining spacer material from the first spacers 502 and block 1814 forms a second layer of spacers material conformally over the recessed sacrificial layers 704. Block 1816 anisotropically etches the second spacers 1004, removing any spacer material on horizontal surfaces or which extends past the protruding channel layers 702 to form the inner spacers 1102.

Block 1818 epitaxially grows source/drain regions 1202/1204 from the exposed faces of the protruding channel layers 704. Block 1820 forms dielectric material 1402 around the dummy gates 402/404 to or above the level of the top surface of the dummy gates 402/404. Block 1822 etches away the dummy gates with an anisotropic etch to expose the remaining sacrificial material 704. The remaining sacrificial material 704 protects the underlying channel layers 1602 from the etch that removes the dummy gates 402/404. Block 1824 removes the remaining sacrificial material 704 to expose the channel layers 1602. Block 1826 then forms the gate stack 1702 over and around the channel layers 1602.

Having described preferred embodiments of a sacrificial layer for channel surface retention and inner spacer formation in stacked-channel FETs (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method of forming a semiconductor device, comprising:

providing sacrificial layers and channel layers over a substrate, wherein the sacrificial layers alternate with the channel layers;

etching through the sacrificial layers and the channel layers to form a fin;

forming a first dummy gate over the fin;

forming an adjacent second dummy gate over the fin while leaving an exposed region of the fin between the first dummy gate and the second dummy gate;

etching through the sacrificial layers and the channel layers of the fin using the dummy gates as a mask to define an opening in the exposed region of the fin, wherein:

the opening comprises a first sidewall and a second sidewall opposing the first sidewall; and the first and second sidewalls each comprise a plurality of exposed side surfaces of the channel layers and a plurality of exposed side surfaces of the sacrificial layers; and epitaxially growing source/drain material on the plurality of exposed side surfaces of the channel layers, wherein:

the source/drain material grown on exposed side surfaces of first vertically adjacent channel layers comprised in the first sidewall merges to form a first source/drain region;

the source/drain material grown on exposed side surfaces of second vertically adjacent channel layers comprised in the second sidewall merges to form a second source/drain region; and the first source/drain region does not merge with the second source/drain region.

2. The method of claim 1, wherein providing the sacrificial layers and the channel layers over the substrate comprises depositing alternating layers of sacrificial material and channel material on an insulating layer on the substrate.

3. The method of claim 2, wherein the etching through the sacrificial layers and the channel layers of the fin using the dummy gates as a mask comprises etching down to the insulating layer.

4. The method of claim 1, wherein the fin is a nanosheet fin.

5. The method of claim 1, wherein the fin is a nanowire fin.

6. The method of claim 1, wherein an uppermost layer of the sacrificial layers and the channel layers is a sacrificial layer.

7. The method of claim 6, further comprising:
subsequent to the etching through the sacrificial layers and the channel layers of the fin using the dummy gates as a mask, laterally etching the exposed side surfaces of the sacrificial layers to form recessed sacrificial layers.

8. The method of claim 7, further comprising:
forming spacers on exposed side surfaces of the recessed sacrificial layers.

9. The method of claim 1, further comprising:
filling a portion of the opening between the first source/drain region and the second source/drain region with a dielectric.

10. The method of claim 9, further comprising:
removing the dummy gates;
removing the sacrificial layers;
forming a gate dielectric on the channel layers; and
forming a work function metal on the gate dielectric.

11. The method of claim 1, further comprising:
subsequent to the etching through the sacrificial layers and the channel layers of the fin using the dummy gates as a mask, laterally etching the sacrificial layers to form recessed sacrificial layers.

12. The method of claim 11, further comprising:
forming spacers on exposed side surfaces of the recessed sacrificial layers.

13. The method of claim 1, wherein epitaxially growing the source/drain material on the plurality of exposed side surfaces of the channel layers comprises growing source/drain material that follows a crystal structure of the plurality of exposed side surfaces of the channel layers.

14. The method of claim 13, wherein first source/drain region and the second source/drain region each comprise a bottom surface disposed on an insulating layer.

15. A method of forming a semiconductor device, the method comprising:
providing sacrificial layers and channel layers over a substrate, wherein the sacrificial layers alternate with the channel layers, wherein a lowermost layer of the sacrificial layers and the channel layers is a sacrificial layer, and wherein an uppermost layer of the sacrificial layers and the channel layers is a sacrificial layer;

etching through the sacrificial layers and the channel layers to form a fin;
forming a first dummy gate over the fin;
forming an adjacent second dummy gate over the fin while leaving an exposed region of the fin between the first dummy gate and the second dummy gate;
etching through the sacrificial layers and the channel layers of the fin using the dummy gates as a mask to define an opening in the exposed region of the fin, wherein:
the opening comprises a first sidewall and a second sidewall opposing the first sidewall; and
the first and second sidewalls each comprise a plurality of exposed side surfaces of the channel layers and a plurality of exposed side surfaces of the sacrificial layers;
epitaxially growing source/drain material on the plurality of exposed side surfaces of the channel layers, wherein:
the source/drain material grown on exposed side surfaces of first vertically adjacent channel layers comprised in the first sidewall merges to form a first source/drain region; and
the source/drain material grown on exposed side surfaces of second vertically adjacent channel layers comprised in the second sidewall merges to form a second source/drain region; and
filling a portion of the opening between the first source/drain region and the second source/drain region with a dielectric.

16. The method of claim 15, wherein providing the sacrificial layers and the channel layers over the substrate comprises depositing alternating layers of sacrificial material and channel material on an insulating layer on the substrate.

17. The method of claim 15, wherein the fin is a nanosheet fin.

18. The method of claim 15, wherein the fin is a nanowire fin.

19. The method of claim 15, further comprising:
removing the dummy gates;
removing the sacrificial layers;
forming a gate dielectric on the channel layers; and
forming a work function metal on the gate dielectric.

20. The method of claim 15, wherein epitaxially growing the source/drain material on the plurality of exposed side surfaces of the channel layers comprises growing source/drain material that follows a crystal structure of the plurality of exposed side surfaces of the channel layers.

21. The method of claim 20, wherein the first source/drain region and the second source/drain region each comprise a bottom surface disposed on an insulating layer.

* * * * *